US011304340B2

(12) United States Patent
Chen et al.

(10) Patent No.: US 11,304,340 B2
(45) Date of Patent: Apr. 12, 2022

(54) LIQUID IMMERSION COOLING TANK AS A HIGH DENSITY AGGREGATED SERVER CHASSIS FOR MODULAR BLADES

(71) Applicants: Robert C V Chen, Livermore, CA (US); Calvin Chu, San Jose, CA (US); Dennis Dantog Ignacio, San Ramon, CA (US); Shankar Kesavan, Union City, CA (US); Vincent Quan Hoang, San Jose, CA (US); Arvind Bhargava, Fremont, CA (US)

(72) Inventors: Robert C V Chen, Livermore, CA (US); Calvin Chu, San Jose, CA (US); Dennis Dantog Ignacio, San Ramon, CA (US); Shankar Kesavan, Union City, CA (US); Vincent Quan Hoang, San Jose, CA (US); Arvind Bhargava, Fremont, CA (US)

(*) Notice: Subject to any disclaimer, the term of this patent is extended or adjusted under 35 U.S.C. 154(b) by 0 days.

(21) Appl. No.: 17/473,932

(22) Filed: Sep. 13, 2021

(65) Prior Publication Data

US 2021/0410337 A1 Dec. 30, 2021

Related U.S. Application Data

(62) Division of application No. 16/889,023, filed on Jun. 1, 2020.

(51) Int. Cl.
*H05K 7/20* (2006.01)

(52) U.S. Cl.
CPC ..... *H05K 7/20772* (2013.01); *H05K 7/20236* (2013.01); *H05K 7/20272* (2013.01)

(58) Field of Classification Search
None
See application file for complete search history.

(56) References Cited

U.S. PATENT DOCUMENTS

| 10,750,637 | B1* | 8/2020 | Alissa | G06F 1/20 |
| 2014/0218861 | A1* | 8/2014 | Shelnutt | H05K 7/20809 |
| | | | | 361/679.53 |
| 2017/0303443 | A1* | 10/2017 | Inano | G06F 1/206 |
| 2017/0354066 | A1* | 12/2017 | Kodama | H05K 7/20236 |
| 2019/0357384 | A1* | 11/2019 | Saito | H05K 7/20763 |
| 2019/0394900 | A1* | 12/2019 | Inano | G06F 1/20 |

(Continued)

*Primary Examiner* — Courtney L Smith
(74) *Attorney, Agent, or Firm* — Lyman Moulton, Esq.; Moulton Patents, PLLC

(57) ABSTRACT

The disclosed computer cooling system includes a liquid immersion cooling tank configured as a server chassis with an integrated power bus, control bus and data bus. The server chassis tank receives and services a plurality of modular blades including disaggregated single server components dedicated to similar functions and resembling a beekeeper's box of vertical and spaced operation, insertion and extraction. The modular blades include at least one management blade, interfaces and peripherals blade, storage blade, CPU blade and one or more GPU blades and other processors. Each blade configures hottest operating components lowest in a heat flow via transverse mounted brackets and vented ends. A blade extraction mechanism includes movable winches for manipulating the plurality of modular blades from a top side of the heat flow and a hydraulic lift for pushing each modular blade from a bottom of the heat flow out of the liquid immersion cooling tank.

8 Claims, 9 Drawing Sheets

(56) References Cited

U.S. PATENT DOCUMENTS

| 2020/0093038 A1* | 3/2020 | Enright | H05K 7/203 |
| 2020/0120831 A1* | 4/2020 | Saito | H05K 7/20763 |
| 2020/0253086 A1* | 8/2020 | Ohga | H05K 7/20272 |
| 2021/0144885 A1* | 5/2021 | Enright | G05D 1/0212 |

* cited by examiner

FIG. 11

400 — configuring a liquid immersion cooling tank as a server chassis comprising an integrated bus for receiving and servicing a plurality of modular blades resembling a beekeeper's box of vertical and spaced operation, insertion and extraction

410 — configuring a plurality of modular blades dedicating disaggregated server components of similar functions with respective hottest operating components lowest in a heat flow in the liquid immersion cooling tank via traverse mounted brackets and vented lower ends

420 — extracting one of the plurality of modular blades via a blade extraction mechanism simultaneously from a top side of the heat flow and from a bottom side of the heat flow out of the liquid immersion cooling tank

FIG. 12

430 — heat flows in the system from a coolest and a lowest point to a hotter and a highest point in the liquid immersion cooling tank and in each of the plurality of modular blades and wherein the liquid immersion cooling tank defines an access opening adjacent the highest point of the heat flow.

440 — disaggregating an aggregated server's functions into the plurality of modular blades by a dedicated same and similar function including processing, storing data and instructions, interfacing and managing administration, security and monitoring.

450 — wherein the modular blade extraction mechanism further comprises movable winches from a top side of the heat flow and a hydraulic lift configured to push each modular blade from a bottom of the heat flow out of the liquid immersion cooling tank

LIQUID IMMERSION COOLING TANK AS A HIGH DENSITY AGGREGATED SERVER CHASSIS FOR MODULAR BLADES

BACKGROUND OF THE INVENTION

The first thing one notices walking into an immersion-cooled data center is the virtual silence. The high-pitched whirring of server fans and air handlers found in air-cooled sites are replace with the subtle hum of fluid pumps. Next, one realizes that the data center is not freezing cold. With immersion cooling, air conditioning is only needed for technician comfort. Air-cooled data centers are cold and noisy without the compute density of comparable immersion-cooled space.

Furthermore, immersion cooling simplifies data center operations. Conventional systems keep coolant inside a rack at a temperature safe for technical staff though higher temperatures are safe for electronic components and equipment. Conventional coolants are made from synthetic stock used in domestic applications and cosmetics.

In contrast to densely packed racks, there is no need to handle heavy IT equipment high in vertical racks or low to the ground when installing or retrieving servers. Also, the virtually silent environment eliminates the need for technical staff to wear hearing protection. Along with health considerations, immersion cooling also permits technical staff to communicate more easily to troubleshoot and resolve issues right at the rack.

Immersion cooling systems also help reduce the number of service events by improving server reliability. Servers immersed in coolant are protected from dust and other air-pollutants, along with moisture and oxygen, hence corrosion. What is more, the absence of server fans eliminates vibrations and reseat errors.

Cooling a data center never used to be so hard. But IT and data center professionals have watched the thermal design power (TDP) of chips rise almost 50% in the last decade, generating more heat and using more power than ever before. Rack density has grown. Hot GPUs (graphics processor units) are becoming the weapon of choice for tackling high-performance computing requirements.

SUMMARY OF THE INVENTION

Single servers are disaggregated into dedicated modular blades of same and similar functions to optimize a heat transfer and fluid dynamics in the liquid cooling tank by immersing the modular blades into a heat flow from hottest bottom components to cooler top components immersed therein. The liquid immersion cooling tank further acts as the server chassis complete with power distribution, data and control buses and precludes the need for air cooling fans and aggregated processor, power distribution, data and control buses and support architectures. In other words, the liquid immersion cooling tank aggregates the modular blades into a server chassis of dedicated functions.

A disclosed computer cooling system comprises a liquid immersion cooling tank configured as a disaggregated server chassis comprising an integrated power bus, an integrated control bus and an integrated data bus. The system and integrated buses are configured to receive and service a plurality of modular blades resembling a beekeeper's box of vertical and spaced operation, insertion and extraction. The system also includes a plurality of modular blades disaggregating and dedicating similar and same functions comprising at least one management blade, interfaces and peripherals blade, storage blade, CPU blade and at least one GPU blade, wherein each blade configures hottest operating components lowest in a heat flow via transverse mounted brackets and vented ends.

The system further includes a blade extraction mechanism comprising movable winches for manipulating the plurality of modular blades from a top side of the heat flow and a hydraulic lift for pushing each modular blade from a bottom of the heat flow out of the liquid immersion cooling tank. Heat flows in the system from a coolest and a lowest point to a hotter and a highest point in the liquid immersion cooling tank and in each of the plurality of modular blades and wherein the liquid immersion cooling tank defines an access opening adjacent the highest point of the heat flow. Additional GPU and Storage modular blades are added to the disclosed system for scaling-out processing and storage needs, respectively.

A disclosed method for cooling a computer system includes configuring a liquid immersion cooling tank as a server chassis comprising an integrated bus for receiving and servicing a plurality of modular blades resembling a beekeeper's box of vertical and spaced operation, insertion and extraction. The method also includes configuring a plurality of modular blades comprising disaggregated server components configured with respective with respective hottest operating components lowest in a heat flow in the liquid immersion cooling tank via transverse mounted brackets and vented lower ends. The method additionally includes extracting one of the plurality of modular blades via a blade extraction mechanism simultaneously from a top side of the heat flow and from a bottom side of the heat flow out of the liquid immersion cooling tank. The method further includes a heat flowing in the system from a coolest and a lowest point to a hotter and a highest point in the liquid immersion cooling tank and in each of the plurality of modular blades. The liquid cooling immersion tank defines an access opening adjacent the highest point of the heat flow. The method yet includes manipulating the modular blades from a top side of the heat flow via a modular blade extraction mechanism of movable winches. The method includes pushing each modular blade from a bottom of the heat flow out of the liquid immersion cooling tank via a modular blade extraction mechanism of a hydraulic lift.

Other aspects and advantages of embodiments of the disclosure will become apparent from the following detailed description, taken in conjunction with the accompanying drawings, illustrated by way of example of the principles of the disclosure.

BRIEF DESCRIPTION OF THE DRAWINGS

FIG. 11 depicts a flow diagram of a method of cooling the liquid immersion cooling tank as a high density server chassis in accordance with an embodiment of the present disclosure.

FIG. 12 depicts another flow diagram of a method of cooling the liquid immersion cooling tank as a high density server chassis in accordance with an embodiment of the present disclosure.

Figure 1:
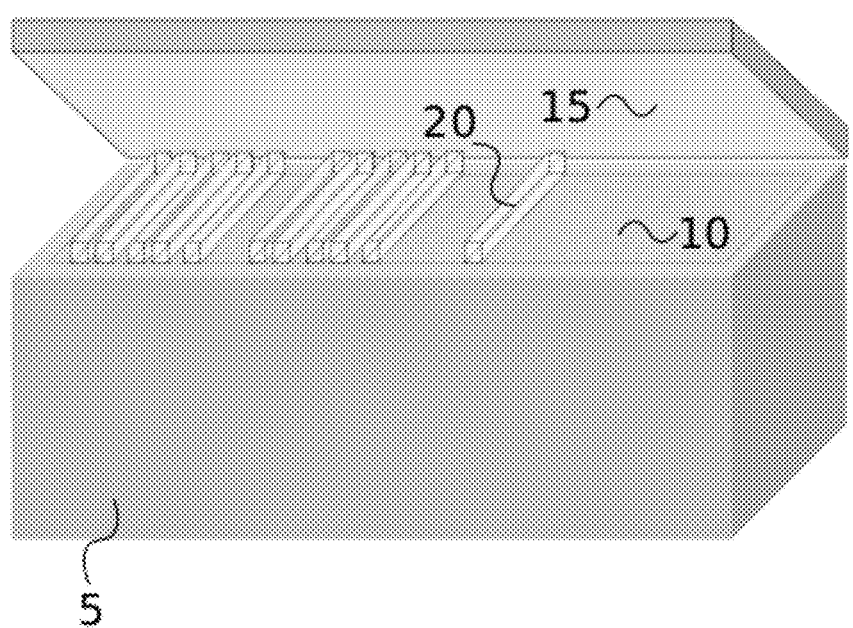
FIG. 1 depicts the liquid immersion cooling tank as a high density server chassis for modular blades in accordance with an embodiment of the present disclosure.

Throughout the description, similar reference numbers may be used to identify similar elements in the several embodiments and drawings. Although specific embodiments of the invention have been illustrated, the invention is not to be limited to the specific forms or arrangements of parts so described and illustrated. The scope of the invention is to be defined by the claims herein and their equivalents.

DETAILED DESCRIPTION

Reference will now be made to exemplary embodiments illustrated in the drawings and specific language will be used herein to describe the same. It will nevertheless be understood that no limitation of the scope of the disclosure is thereby intended. Alterations and further modifications of the inventive features illustrated herein and additional applications of the principles of the inventions as illustrated herein, which would occur to one skilled in the relevant art and having possession of this disclosure, are to be considered within the scope of the invention.

Throughout the present disclosure, the term 'server chassis' refers to a physical structure that is used to house or physically assemble servers in various different form factors. The server chassis makes it possible to put multiple servers and other storage and peripheral equipment in a single physical body. The terms 'aggregated,' and 'disaggregated,' refer respectively to components operating on a single substrate and on multiple substrates of varying percentages of same and similar component types. In other words, an aggregated single server blade composes a processor, memory, management, power distribution, control and data buses. A disaggregated modular blade comprises several processors and some support components for a partially disaggregated modular blade to all processors and no support components for a completely disaggregated modular blade. Therefore a CPU modular blade, for example, comprises all CPU components and very little support components if any. On the other hand, another CPU modular blade, for example comprises several co-processor CPUs and some support components. Similarly, a GPU modular blade, a Storage modular blade, a management modular blade, an accelerator modular blade, etc, are dedicated to a particular function in the effective liquid immersion cooling tank as a server chasses to varying degrees based on heat transfer and fluid dynamics for thermal management thereof.

The term 'modular blade,' refers to a disaggregated substrate for dedicating similar and same functions including but not limited to CPU (central processing unit), GPU (graphics processing unit), FPU (floating point processing unit), DSP (digital signal processor), Media processor, ASIC (application specific integrated circuit) processor, PSU (power supply unit), Storage, Interfaces, and Management as explained and detailed throughout the present disclosure. 'Transverse,' is used throughout the present disclosure to describe components which are lengthwise situated side by side relative to a lengthwise side of a modular blade. In other words, transverse components are lengthwise parallel to a lateral dimension of the modular blade. The term 'backplane,' refers to a group of electrical connectors in parallel with each other wherein each pin of each connector is linked to the same relative pin of all the other connectors. Therefore and accordingly, the phrase 'tank as a chassis,' is defined as each disaggregated modular blade having individual power needs supplied by an external Power Distribution Unit (PDU) that is either attached or built-in the cooling tank. Thus, there is no need for PSU (power supply units) and a removal of respective fans. The term 'modular class blade,' refers to the modular blades dedicated to specific functions such as GPU, CPU, Storage, Interface, Management and etc.

FIG. 1 depicts the liquid immersion cooling tank as a high density server chassis for modular blades in accordance with an embodiment of the present disclosure. The depiction includes the cooling tank 5, the cooling fluid 10, the modular class blades 20 and the lid of the cooling tank 15. The lid 15 is shown hinged on a lengthwise side but may also hinge from any edge and not be hinged at all. The lid may be metallic or a transparent material allowing visual inspection of the cooling tank. The modular class blades 20 extend into the cooling fluid 10 and are therefore not depicted below a level of the cooling fluid 10 for depiction purposes. Also, the modular blades are covered and immersed completely in operation and not visible above the level of the cooling fluid 10 depicted.

Figure 2:
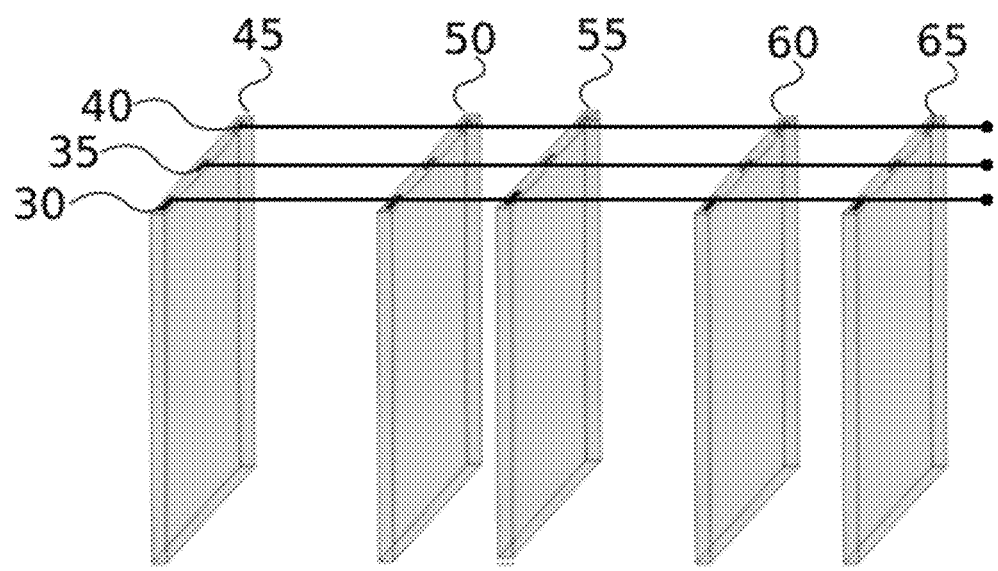
FIG. 2 depicts types of high density modular blades with integrated control, data and power buses in accordance with an embodiment of the present disclosure.

FIG. 2 depicts types of high density modular blades with integrated control, data and power buses in accordance with an embodiment of the present disclosure. The depiction includes the power bus 30, the data bus 35, the control bus 40, the accelerator blade 45, the central processing blade 50, the storage blade 55, the management blade 60 and the interfaces blade 65 disposed in the cooling tank (not shown). For depiction purposes, the modular blades are shown outside of the cooling tank chassis but are immersed completely therein in operation. Also for depiction purposes, the respective modular blades are shown in block diagram form but in built-out installation include components which are hereafter detailed and described.

Figure 3:
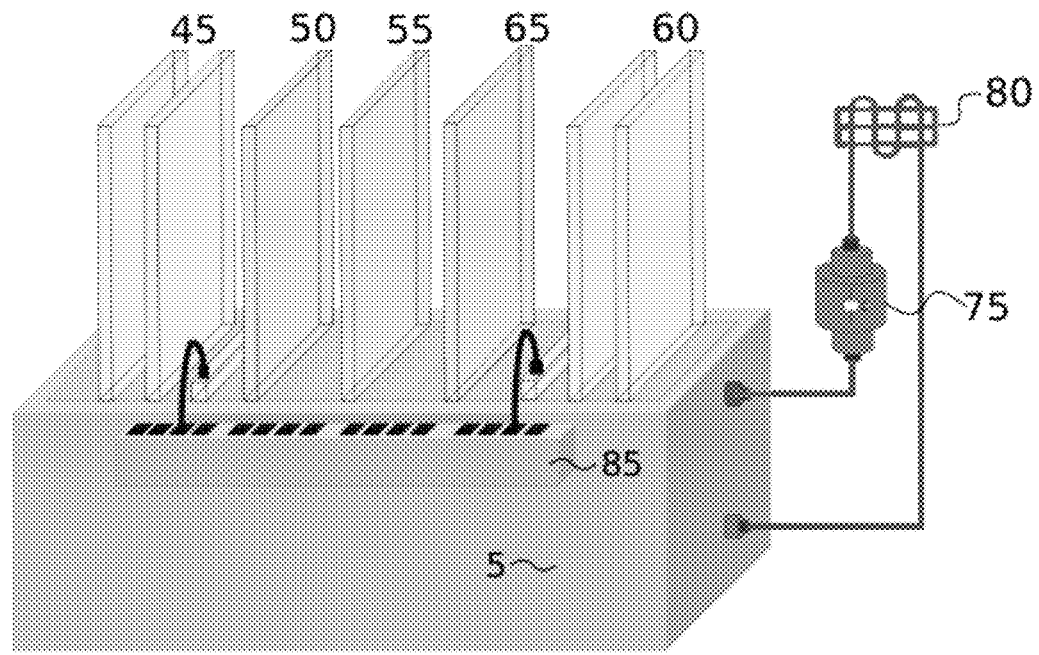
FIG. 3 depicts an expanded view of the liquid immersion cooling tank as a high density server chassis for modular blades with fluid circulation in accordance with an embodiment of the present disclosure.

FIG. 3 depicts an expanded view of the liquid immersion cooling tank as a high density server chassis for modular blades with fluid circulation in accordance with an embodiment of the present disclosure. The depiction includes the immersion tank 5, the graphics accelerator blades 45, the central processing blade 50, the storage blade 55, the interface blade 65 and the management blades 60, the fluid pump 75, and the heat exchanger 80. The external power distribution 85 sits adjacent the cooling tank and supplies electrical power to each blade on a backplane or a power line. The fluid pump 75 circulates the cooling fluid in the cooling tank through the heat exchanger 80. The cooling fluid 10 will circulate in the cooling tank 5 without the fluid and without the heat exchanger under physical properties of heat transfer and fluid dynamics. However, the fluid pump and the heat exchanger accelerate the heat transfer and fluid dynamics in a more time efficient manner. The open server approach modularizes each blade for dedicated functions. The central processing blade runs any Linux distribution. The dedicated management blade enables administration, security and monitoring.

Figure 4:
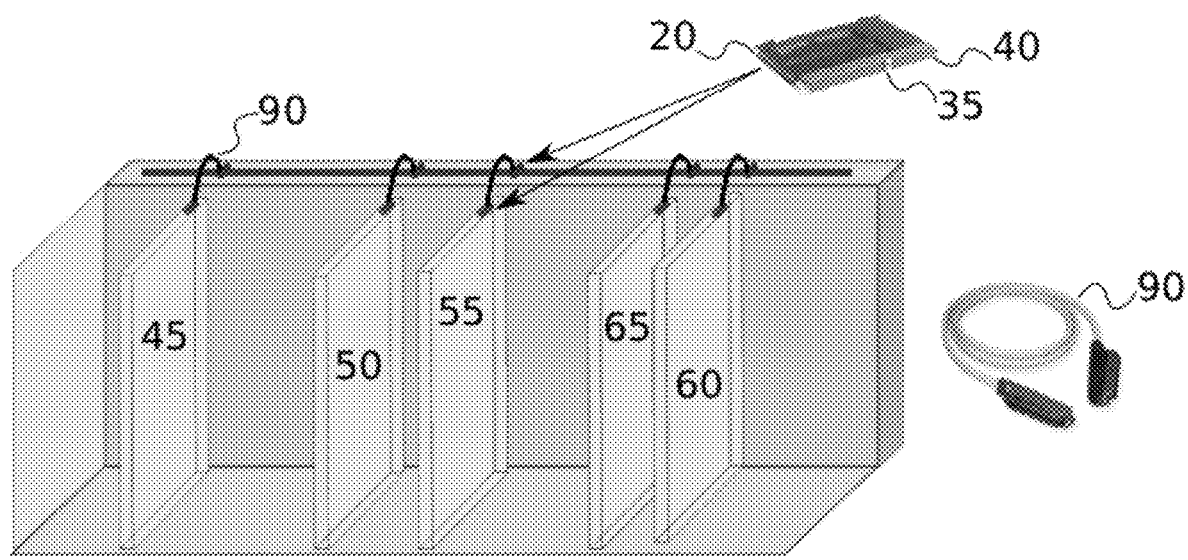
FIG. 4 depicts a high speed backplane for control and data buses for signaling and communication between modular blades in accordance with an embodiment of the present disclosure.

FIG. 4 depicts a high speed backplane for control and data buses for signaling and communication between modular blades in accordance with an embodiment of the present disclosure. The depiction includes the cooling tank interior view of the GPU blade 45, the CPU blade 50, the storage blade 55, the interface blade 65 and the management blade 60. A perspective view of a modular class blade 20 is included with a data bus 35 and a control bus 40 at an edge connector of the modular blade 20. The high speed connector cabling 90 supports the high speed backplane 90 in distributing power, data and control for signaling and communication modular blade to modular blade through the tank backplane and to peripherals and external digital hardware.

Figure 5:
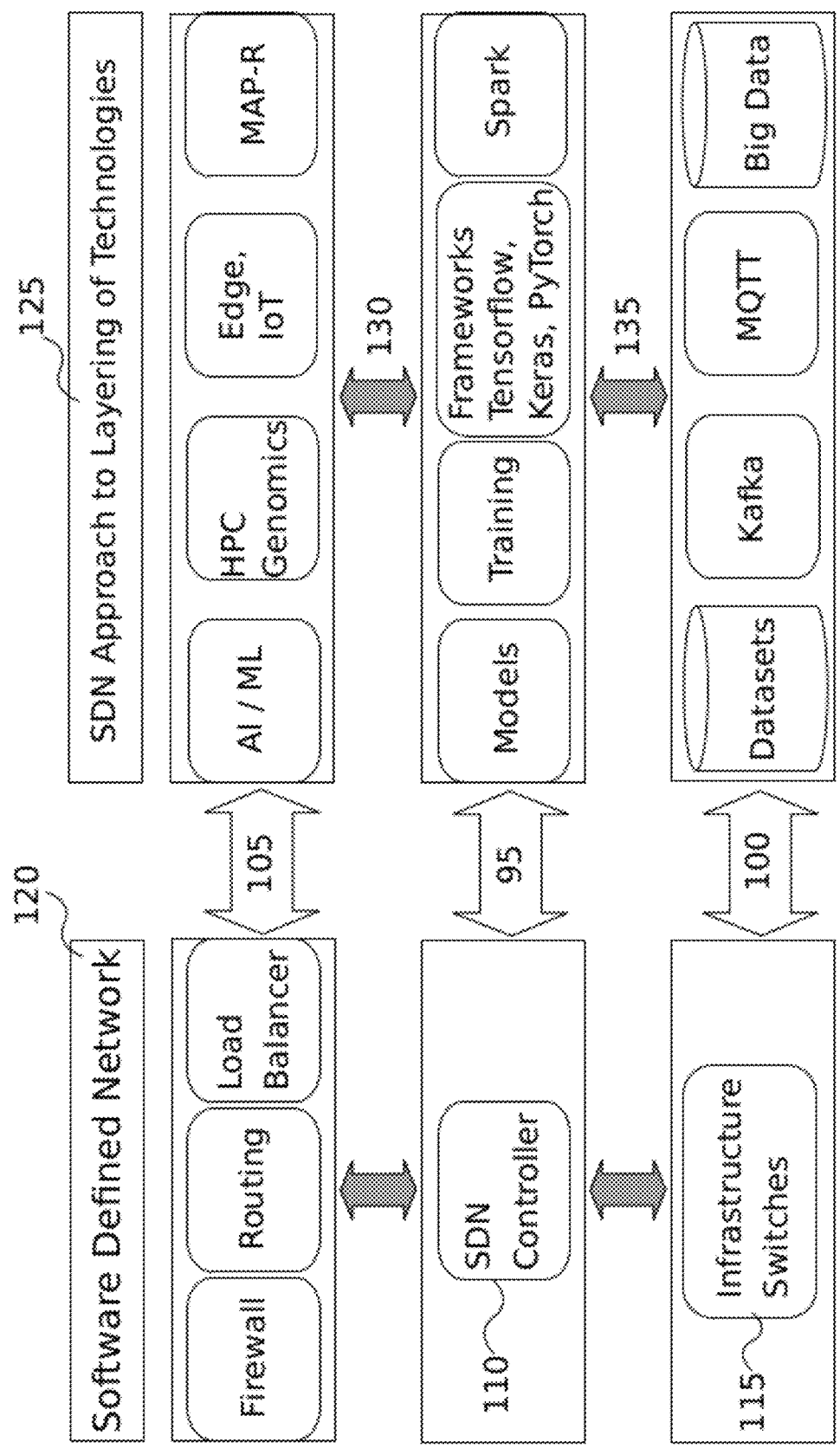
FIG. 5 depicts block diagram components of a software defined network architecture with a layering technologies approach in accordance with an embodiment of the present disclosure.

FIG. 5 depicts block diagram components of a software defined network architecture with a layering technologies approach in accordance with an embodiment of the present disclosure. The depiction includes the control layer 95, the data layer 100, the application layer 105, the SDN (software defined network) controller 110, the SDN 120, the SDN approach to layering of technologies 125, the Northbound APIs (application programming interfaces) 130 and the Southbound APIs 135.

Figure 6:
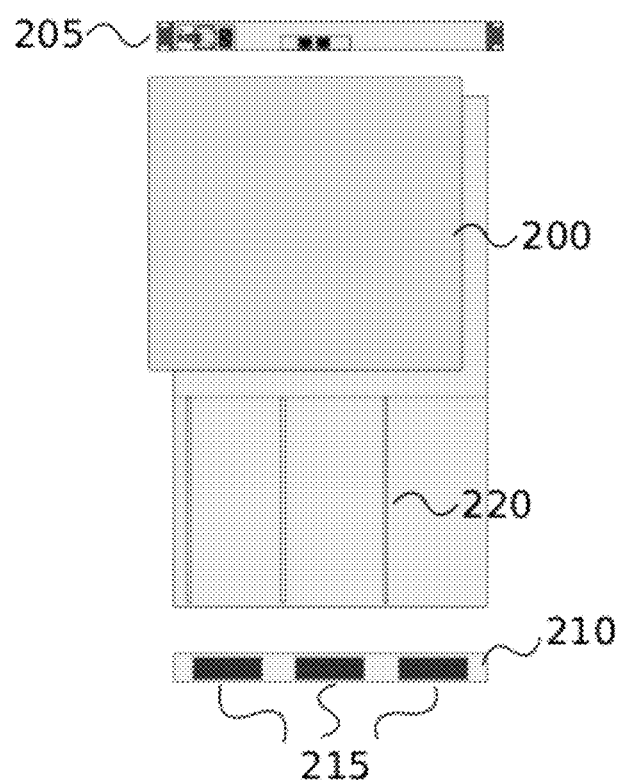
FIG. 6 depicts a top view and end views of a single server with transverse brackets in accordance with an embodiment of the present disclosure.

FIG. 6 depicts a top view and end views of a single server with transverse brackets in accordance with an embodiment of the present disclosure. The depiction includes the side panel removed 200, the top end 215, the bottom end 210, the transverse mounted brackets 220 and the bottom end vents 215. Brackets are transverse mounted to not obstruct cooling liquid flow. The chassis side panel exposes a lower third of the aggregated single server to provide optimal liquid contact for heat transfer and cooling. Medical grade metals are used throughout the system for optimal performance. Components are disposed on the aggregated single server with highest operating temperatures located at the lowest end of the chassis for optimal heat flow, optimal fluid dynamics and optimal heat transfer. The bottom end 210 is vented for efficient liquid flow.

Figure 7:
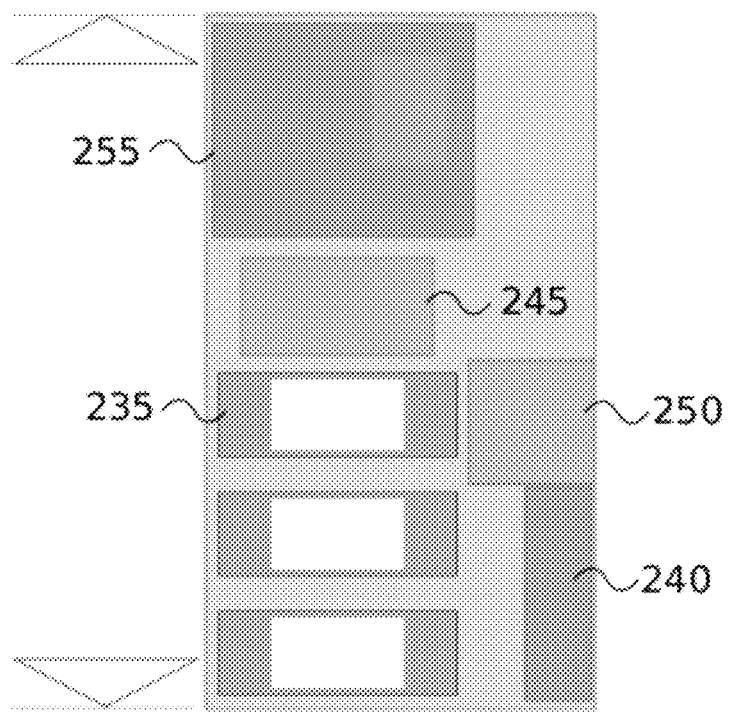
FIG. 7 depicts a block diagram view of a partially disaggregated longitudinal processor server layout in accordance with an embodiment of the present disclosure.

FIG. 7 depicts a block diagram view of a partially disaggregated longitudinal processor server layout in accordance with an embodiment of the present disclosure. A GPU modular blade is a customized electronic circuit board mounted in a lightweight but strong chassis for installing and connecting a maximum number of Graphics Processing Unit (GPU) cards for immersion cooling. It will have provisions for power and current PCIE connectivity. It will have harnesses to secure GPU cards in place to prevent any movement while immersed in coolant liquid. An implementation includes the processor units 235 which are GPU or CPU (central processing units) or FPU (floating point processing unit) or DSP (digital signal processor) or a Media processor or an ASIC processor depending on an aggregated or disaggregated implementation. The PSU (power supply unit) 240, the non-volatile solid state drive 245, the PSU breakout board 250 and a subsequent processing unit 255 which is a CPU (central processing unit) or a subsequent GPU (graphics processing unit) or FPU or DSP or Media processor or an ASIC processor depending on an aggregated or disaggregated implementation. Embodiments of the disclosure include a modular blade configuration where the processing units 235 and 255 are respectively part of a co-processor CPU implementation or a co-processor GPU implementation or co-processor FPU or a DSP co-processor or Media co-processor or an ASIC co-processor implementation. The processing unit 255 is located proximal the top and the processing units 235 are proximal a bottom of the aggregated single server.

Figure 8:
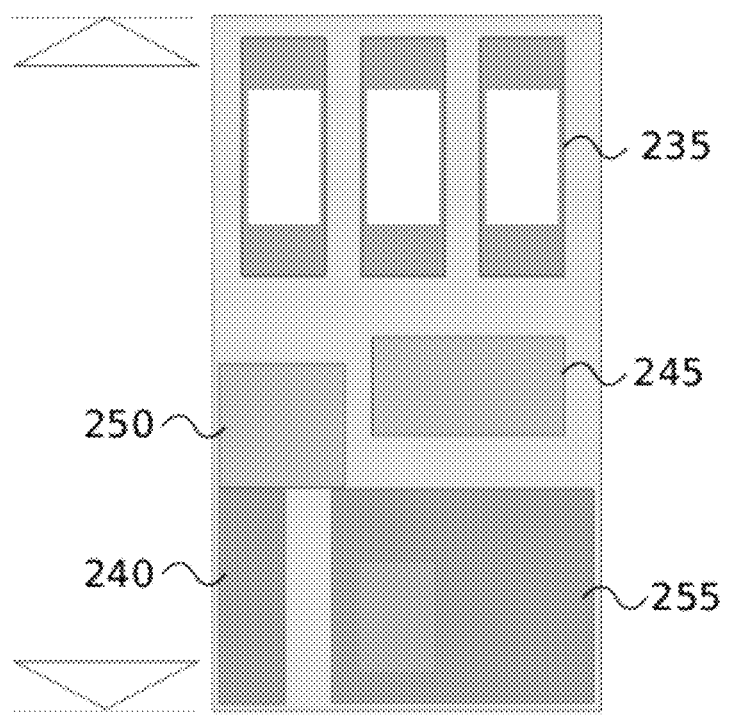
FIG. 8 depicts a block diagram view of a partially disaggregated transverse processor server layout in accordance with an embodiment of the present disclosure.

FIG. 8 depicts a block diagram view of a partially disaggregated transverse processor server layout in accordance with an embodiment of the present disclosure. The CPU blade is a customized electronic board mounted in a lightweight but strong chassis for installing one or more CPUs and main memory. It will have industry specifications for CPU sockets and Dual In-line Memory Module sockets. The Central Processing Blade is effectively a motherboard with external connections for PCIE and other peripherals such as network interfaces. The Central Processing Blade is where the system's Operating System will be installed. The depiction further includes the transverse mounted processor unit 235 which are GPU or CPU or FPU or DSP or Media processor or an ASIC processor depending on an aggregated or disaggregated implementation. The PSU (power supply unit) 240, the non-volatile solid state drive 245, the PSU breakout board 250 and the subsequent processing unit 255 which is a GPU or a CPU or FPU or DSP or Media processor or ASIC processor depending on an aggregated or disaggregated implementation. The subsequent processing unit 255 is located proximal the bottom and the transverse mounted processing units 235 are proximal a top thereof. The transverse orientation enables a top to bottom heat transfer and fluid dynamic for efficient cooling proximal a top thereof. Embodiments of the disclosure include a modular blade configuration where the processing units 235 and 255 are respectively part of a co-processor CPU implementation or a co-processor GPU implementation or a FPU co-processor implementation or a DSP co-processor implementation or Media co-processor or ASIC co-processor.

In other words, an aggregated single server blade composes a processor, memory, management, power distribution, control and data buses. A disaggregated modular CPU blade comprises several processors and some support components or comprises all processors and no support components. Therefore a CPU modular blade, for example, comprises all CPU components and very little support components if any. On the other hand, another CPU modular blade, for example, comprises several co-processor CPUs and some support components immersed in the liquid cooling tank as a server chassis to varying degrees based on heat transfer and fluid dynamics for thermal management thereof.

Figure 9:
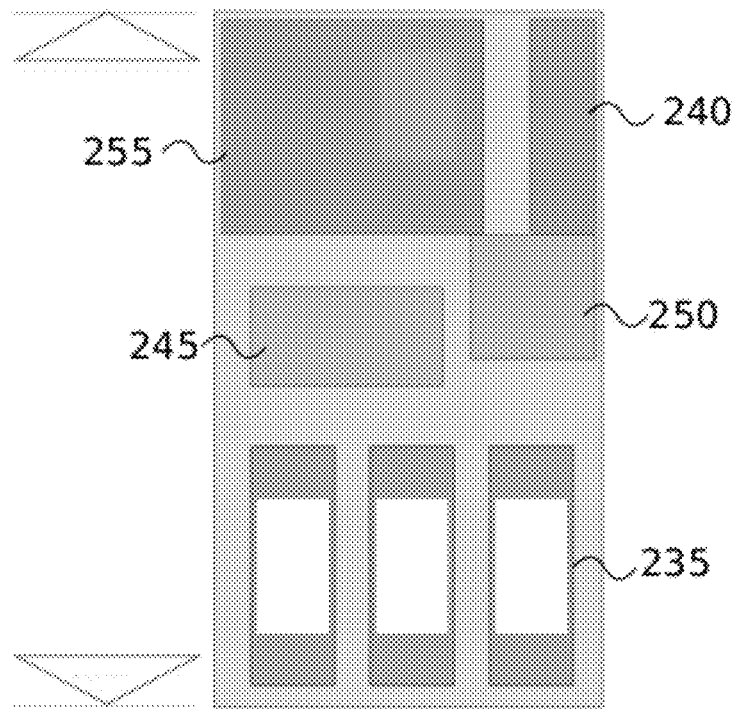
FIG. 9 depicts a block diagram view of another partially disaggregated transverse server layout in accordance with an embodiment of the present disclosure.

FIG. 9 depicts a block diagram view of another partially disaggregated transverse processor layout in accordance with an embodiment of the present disclosure. The storage blade is a customized electronic board mounted in a lightweight but strong chassis for installing various types of Solid-State Drives (SSD) such as 2.5 inch Flash Drives and M.2 SSDs. It will effectively be a JBOF unit—Just a Bunch of Flash, with high-speed connections for minimal latency. The depiction further includes the transverse mounted processor units 235 which are GPU or CPU or FPU or DSP or Media processor or ASIC processor depending on an aggregated or disaggregated implementation. The PSU (power supply unit) 240, the non-volatile solid state drive 245, the PSU breakout board 250 and the subsequent processing unit 255 which is a CPU or a GPU or FPU or DSP or Media processor or ASIC processor depending on an aggregated or disaggregated implementation. The subsequent processing unit 255 is located proximal the bottom and the transverse mounted processing units 235 are proximal a top of the single server. The transverse orientation enables a top to bottom heat transfer and fluid dynamic for efficient cooling proximal a bottom thereof. Embodiments of the disclosure include a modular blade configuration where the processing units 235 and 255 are respectively part of a co-processor CPU implementation or a co-processor GPU implementation or FPU co-processor implementation or a DSP co-processor implementation or a Media co-processor or an ASIC co-processor.

Figure 10:
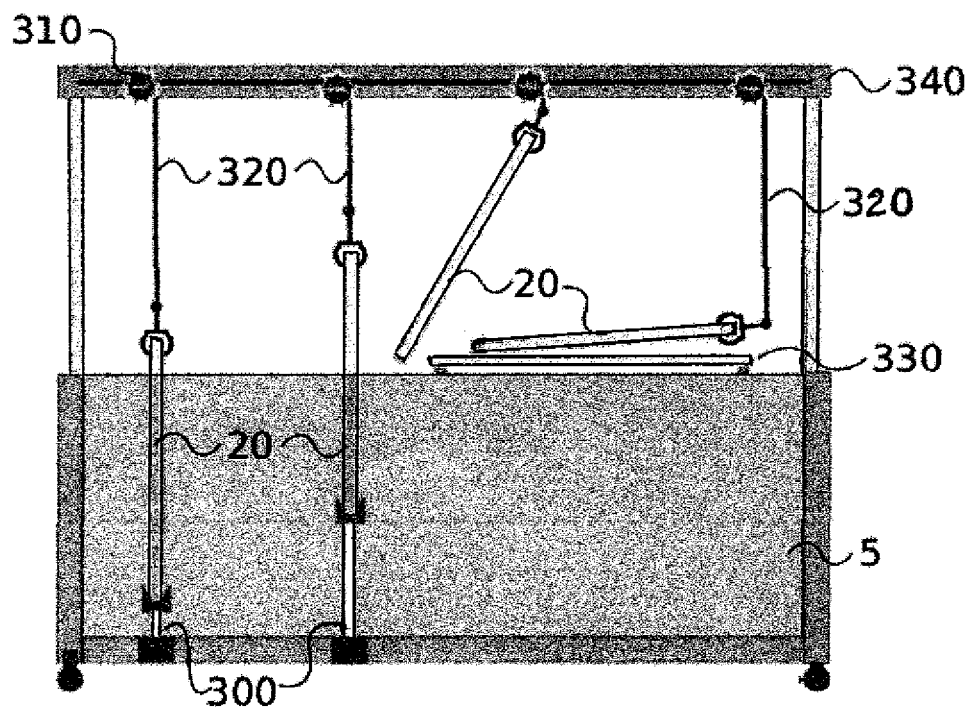
FIG. 10 depicts a serviceability and modular blade extraction mechanism for the liquid immersion cooling tank as a high density server chassis in accordance with an embodiment of the present disclosure.

FIG. 10 depicts a serviceability and modular blade extraction mechanism for the liquid immersion cooling tank as a high density server chassis in accordance with an embodiment of the present disclosure. The interfaces blade is a customized electronic board mounted in a lightweight but strong chassis with multiple Network Interfaces (10 GB-Ethernet, 100 GB-Ethernet, 1000 GB-Ethernet, Optical, FiberChannel, and more. It will also have various Peripheral interfaces PCIE, USB, Thunderbolt, Serial, Bluetooth, etc. The depiction further includes the liquid immersion cooling tank 5, the modular blades 20, the hydraulic lift 300 for pushing each modular class blade 20 out of the tank 5, the blade extraction mechanism 310 with movable winches for manipulating the modular class blades 20. The depiction also includes the winches 320, the maintenance platform 330 for drainage and access to components and the blade extraction boom 340. Heavy duty locking casters are used for mobility and tank maintenance.

FIG. 11 depicts a flow diagram of a method of cooling the liquid immersion cooling tank as a high density server chassis in accordance with an embodiment of the present disclosure. The method includes configuring 400 a liquid immersion cooling tank as a server chassis comprising an integrated bus for receiving and servicing a plurality of modular blades resembling a beekeeper's box of vertical and spaced operation, insertion and extraction. The method also includes configuring 410 a plurality of modular blades dedicating disaggregated server components of similar functions with respective hottest operating components lowest in a heat flow in the liquid immersion cooling tank via transverse mounted brackets and vented lower ends. The method further includes extracting 420 one of the plurality of modular blades via a blade extraction mechanism simultaneously from a top side of the heat flow and from a bottom side of the heat flow out of the liquid immersion cooling tank.

FIG. 12 depicts another flow diagram of a method of cooling the liquid immersion cooling tank as a high density server chassis in accordance with an embodiment of the present disclosure. The method includes a heat flowing 430 in the system from a coolest and a lowest point to a hotter and a highest point in the liquid immersion cooling tank and in each of the plurality of modular blades. The liquid cooling immersion tank defines an access opening adjacent the highest point of the heat flow. The method also includes disaggregating 440 an aggregated server's functions into the plurality of modular blades by a dedicated same and similar function including processing, storing data and instructions, interfacing and managing administration, security and monitoring. The method additionally includes manipulating 450 the modular blades from a top side of the heat flow via a modular blade extraction mechanism and pushing each modular blade from a bottom of the heat flow out of the liquid immersion cooling tank via a modular blade extraction mechanism of a hydraulic lift.

In other words, the disclosure disaggregates single aggregated servers into dedicated blades for GPUs, Central Processing units or FPUs, Storage, etc. for cooling tank immersion heat transfer via ambient and dynamic fluid dynamics. The liquid immersion cooling tank aggregates the modular blades into a server chassis of dedicated functions For example a modular GPU Blade is a customized electronic circuit board mounted in a lightweight but strong chassis for installing and connecting a maximum number of Graphics Processing Unit (GPU) cards for immersion cooling. It has provisions for power and current PCIE connectivity. It has harnesses to secure GPU cards in place to prevent any movement while immersed in the coolant liquid.

A modular Central Processing Blade is a customized electronic board mounted in a lightweight but strong chassis for installing one or more CPUs and main memory. It has industry specifications for CPU sockets and Dual In-line Memory Module sockets. The Central Processing Blade is effectively a motherboard with external connections for PCIE and other peripherals such as network interfaces. The Central Processing Blade is where the system's Operating System is installed.

A Floating Point processor is specially designed to carry out operations on floating-point numbers. Operations include addition, subtraction, multiplication, division, and square root. FPUs can also perform various transcendental functions such as exponential or trigonometric calculations, with varying accuracy so embodiments compute these functions in software. In aggregated servers, one or more FPUs are integrated as execution units within the central processing unit; however, many embedded processors do not have hardware support for floating-point operations while they increasingly have them as standard, at least 32-bit ones.

A Digital Signal Processor is used for measuring, filtering and/or compress digital or analog signals. The signal processing means analysis and manipulation of signal. This processing can be done via computer or Application Specific Integrated Circuits (ASIC), Field Programmable Gate Array (FPGA) or Digital Signal Processor (DSP) to obtain the clear signal. The DSP processors are used in an oscilloscope, barcode scanners, mobile phones, printers, etc. These processors are fast and use for real-time applications.

A media processor is designed or created to deal with image, video and audio data in real-time. The voice user interface and professional audio are the applications of the audio processor. Some of the media processors are TN2302AP IP, IN2602 AP IP, DM3730, DM3725, DM37385, DM388, TMS320DM6467, TMS320DM6431, etc An ASIC processor (application-specific integrated circuits) are built for specific applications. These processors are small in size and consume low power. The design cost of ASIC is high and this is the main disadvantage. The application-specific integrated circuit chips are used in satellites, modems, computers, etc. Some of the top ASICs manufacturer companies are Ams AG. Listed Company, Bitfury. Private Company, XMOS Semiconductor Private Company, Analogix Semiconductor Private Company, EDAptive Computing Private Company, Lumen Radio Private Company, Integrated Device Technology, Hookit. Private Company, etc.

A modular Storage Blade is a customized electronic board mounted in a lightweight but strong chassis for installing various types of Solid-State Drives (SSD) such as 2.5 inch Flash Drives and M.2 SSDs. It is effectively be a JBOF unit—Just a Bunch of Flash, with high-speed connections for minimal latency.

A modular Interfaces Blade is a customized electronic board mounted in a lightweight but strong chassis with multiple Network Interfaces (10 GB-Ethernet, 100 GB-Ethernet, 1000 GB-Ethernet, Optical, FiberChannel, and more. It has various Peripheral interfaces—PCIE, USB, Thunderbolt, Serial, Bluetooth, etc.

Each blade has individual power needs supplied by an external Power Distribution Unit (PDU) that is either attached or built-in the tank. Thus, there is no need for PSUs and the removal or disabling of respective fans. The modular blades include at least one management blade, interfaces and peripherals blade, storage blade, Central Processing blade and one or more GPU blades. Additional GPU and Storage blades are easily added to the system for scaling-out processing and storage needs, respectively.

Therefore, in embodiments of the disclosure, disaggregated processors are grouped on dedicated modular blades to optimize heat transfer and fluid dynamics in the liquid cooling tank by immersing the modular blades into a heat flow from hottest bottom components to cooler top components immersed therein. The cooling tank further acts as the server chassis complete with power distribution, data and control buses and precludes the need for air cooling fans and aggregated processor and support architectures. The liquid immersion cooling tank aggregates the modular blades into a server chassis of dedicated functions The disclosure therefore fills a need heretofore unmet in the cooling space for high density servers.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

While the forgoing examples are illustrative of the principles of the present disclosure in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the disclosure be limited, except as by the specification and claims set forth herein.

What is claimed is:

1. A computer cooling system, comprising:
    a) plurality of modular blades comprising at least one disaggregated management blade, interfaces and peripherals blade, storage blade, CPU blade and GPU blade, wherein each blade configures hottest operating components lowest in a coolest portion of a heat flow to optimize heat transfer;
    b) a liquid immersion cooling tank configured as a single server chassis comprising a backplane having a power bus, a control bus and a data bus and configured to receive and service the plurality of modular blades resembling a beekeeper's box of vertical and spaced operation, insertion and extraction; and
    c) a blade extraction mechanism comprising movable winches for manipulating the plurality of modular blades from a top side of the heat flow and a hydraulic lift for pushing each modular blade from a bottom of the heat flow out of the liquid immersion cooling tank,
    wherein the ambient heat flows from a coolest and a lowest point to a hotter and a highest point in the liquid immersion cooling tank and in each of the plurality of modular blades and wherein the liquid immersion cooling tank aggregates the modular blades into the single server chassis.

2. The system of claim 1, wherein the blade extraction mechanism comprises movable winches for manipulating the plurality of modular blades from the heat flow.

3. The system of claim 1, wherein the blade extraction mechanism further comprises a hydraulic lift configured to push each modular blade from the heat flow and out of the liquid immersion cooling tank.

4. The system of claim 1, further comprising a fluid pump and a heat exchanger and a fluid pump and a heat exchanger configured to remove heat from the heat flow in the liquid immersion cooling tank.

5. The system of claim 1, further comprising a plurality of power supply components integral to the liquid immersion cooling tank and having disabled air fans to reduce a power consumption of the system.

6. The system of claim 1, wherein the liquid immersion cooling tank further comprises double hull stainless steel walls to prevent corrosion and leakage of a liquid therein.

7. The system of claim 1, further comprising a maintenance platform configured for drainage and access to the plurality of modular blades and the blade extraction mechanism.

8. The system of claim 1, wherein the liquid immersion cooling tank further comprises an integrated temperature gauge, temperature alarm and RFID (radio frequency identification).

* * * * *